United States Patent [19]
Miller

[11] Patent Number: 5,608,403
[45] Date of Patent: Mar. 4, 1997

[54] MODULATED RADIATION PULSE CONCEPT FOR IMPAIRING ELECTRICAL CIRCUITRY

[75] Inventor: Robert B. Miller, Albuquerque, N.M.

[73] Assignee: The Titan Corporation, San Diego, Calif.

[21] Appl. No.: 381,137

[22] Filed: Jan. 31, 1995

[51] Int. Cl.$^6$ .................................................... H04K 3/00
[52] U.S. Cl. ........................... 342/13; 342/14; 315/5.41; 315/500; 378/1
[58] Field of Search .................................. 315/4, 5, 5.41, 315/5.42, 500, 505; 331/79; 313/359.1, 360.1; 342/13, 14; 378/1, 119, 121; 455/1

[56] References Cited

U.S. PATENT DOCUMENTS

| | | | |
|---|---|---|---|
| 3,761,828 | 9/1973 | Pollard et al. | 315/5.41 X |
| 4,329,654 | 5/1982 | Chamberlain | 315/500 |
| 4,733,133 | 3/1988 | Dondl | 315/39 X |
| 4,959,559 | 9/1990 | Ziolkowski | 342/13 X |

Primary Examiner—Benny T. Lee
Attorney, Agent, or Firm—Ellsworth R. Roston; Charles H. Schwartz

[57] ABSTRACT

An electron beam is generated in a packetized form defined by pulses having a duty cycle of less than 1:1000. Each pulse may have a width of approximately one microsecond (1 μsec.) and may be separated by approximately one (1) second from the next pulse. The electrical beam may be accelerated, preferably linearly. The electrical beam may be modulated at a particular frequency (e.g. 3 gigahertz) by bunching the electrons during the beam acceleration. The electrons may be converted to photons (e.g. X-rays) by directing the electron beam to a target made from a suitable material (e.g. tungsten). The photons are then interacted with the electrical circuitry to produce photoelectrons. The photoelectrons impair the operation of the electronic circuitry by generating an electrical current in the electrical circuitry, generating capacitive charges in the circuitry and generating an electromagnetic field in the vicinity of the circuitry. The electrical circuitry may be disposed within an enclosure substantially impervious to the penetration of external electromagnetic fields, but passing energetic photons (x-rays). The enclosure may resonate at the modulating frequency. This invention is primarily intended to be used for experimental purposes to determine how the electrical circuitry may be protected to prevent the electrical circuitry from being operationally impaired by photons passing to the electrical circuitry.

21 Claims, 1 Drawing Sheet

MODULATED RADIATION PULSE CONCEPT FOR IMPAIRING ELECTRICAL CIRCUITRY

This invention relates to a system for, and a method of, impairing the operation of electrical circuitry. The invention particularly relates to a system for, and a method of, generating photons for introduction to electrical circuitry for impairing the operation of such circuitry even when such circuitry is disposed within an enclosure impervious to external electromagnetic fields, such as powerful microwave pulses.

BACKGROUND OF THE INVENTION

Electrical circuitry is receiving increasingly wide acceptance for performing a number of progressively sophisticated functions. Generally, the electrical circuitry is disposed on an integrated circuit chip. As the micron size indicating the thickness of the leads in the integrated circuitry chip has decreased, the amount of circuitry capable of being disposed on the chip has progressively increased.

The operation of such integrated circuit chips can be impaired by subjecting such chips to microwave energy. This microwave energy generates a flow of electrons which impinge upon the integrated circuit chips and impair the operation of these chips.

To counteract the damaging effects of microwave energy, integrated circuit chips have been disposed in enclosures, preferably metallic, which are impenetrable to microwave energy. The enclosures have been constructed in a manner to produce coupling losses of several tens of decibels even at openings in such enclosures. Thus, even though it is now possible to generate very powerful microwave energy, it is also possible to shield effectively against such microwave energy.

Attempts have been made to use the microwave energy in ways to penetrate the enclosures for the integrated circuits and impair the operation of the circuitry on such chips. Until now, such effort has not been generally successful. This invention provides a system for and method of converting the microwave energy to another energy form which will penetrate the enclosures and impair the operation of the integrated circuitry in such enclosures.

BRIEF DESCRIPTION OF THE INVENTION

In one embodiment of the invention, an electron beam is generated in a packetized form defined by pulses having a duty cycle of less than 1:1000. Each pulse may have a width of approximately one microsecond (1 μsec.) and may be separated by approximately one (1) second from the next pulse. The electrical beam may be accelerated, preferably linearly. The electrical beam may be modulated at a particular frequency (e.g. 3 gigahertz) as by bunching the electrons during the beam acceleration.

The kinetic energy of electrons in the beam may be converted to photon energy (e.g. X-rays) as by directing the electron beam to a target made from a suitable material (e.g. tungsten). The photons are then interacted with the electrical circuitry to produce photoelectrons at the modulator frequency of the electron beam. The photoelectrons impair the operation of electronic circuitry by generating an electrical current in the electrical circuitry, generating capacitive charges in the circuitry and generating an electromagnetic field in the vicinity of the circuitry.

The electrical circuitry may be disposed within an enclosure substantially impervious to the penetration of external electromagnetic fields (e.g. of a microwave pulse), but passing energetic photons (x-rays). The enclosure may be constructed to resonate at the modulating frequency of the electron beam. This invention is primarily intended to be used for experimental purposes to determine how the electrical circuitry may be protected to prevent the electrical circuitry from being operationally impaired by the energetic photons passing to the electrical circuitry.

DETAILED DESCRIPTION OF THE INVENTION

Figure 1:
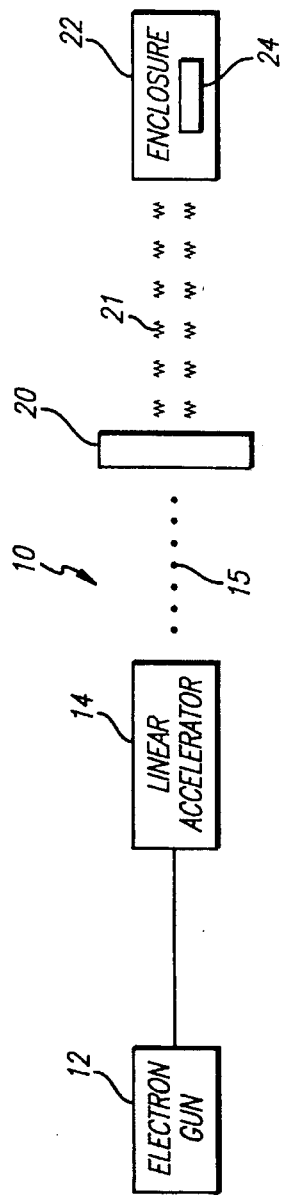
FIG. 1 is a schematic view, partly in block form, of apparatus constituting one embodiment of the invention for impairing the operation of electrical circuitry in an enclosure.
Figure 2:
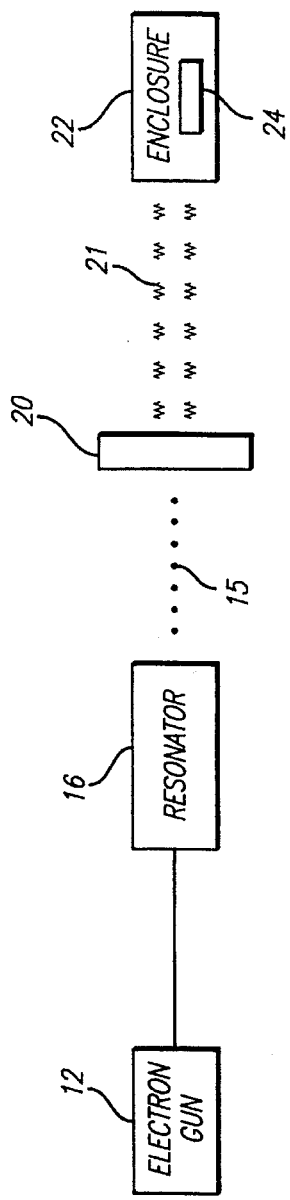
FIG. 2 is a schematic view, partly in block form, of apparatus constituting a second embodiment of the invention for impairing the operation of electrical circuitry in an enclosure.
Figure 3:
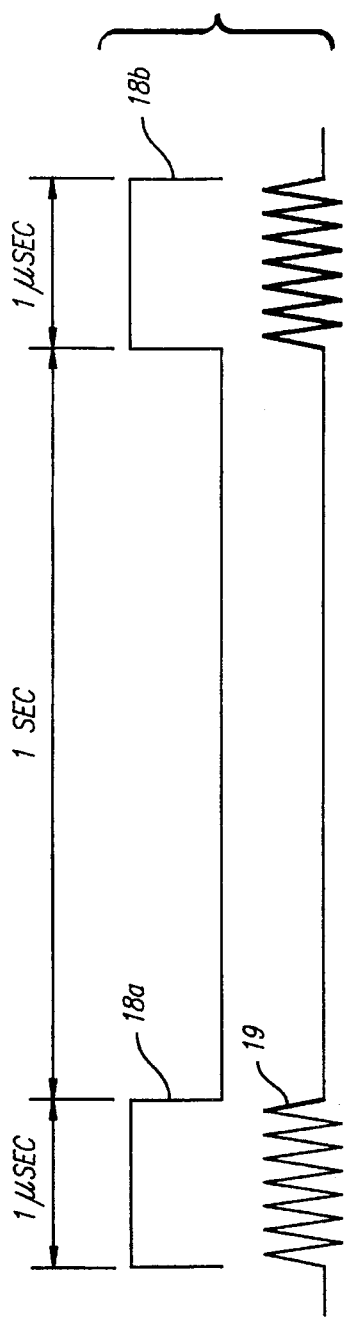
FIG. 3 is a schematic view further illustrating the operation of the apparatus shown in FIGS. 1 and 2.

FIG. 1 illustrates one embodiment of the invention. This embodiment, generally indicated at 10, includes a member 11 for generating a steady beam of electrons (an electron gun), and a member 12 for generating microwave energy. The member 12 may be include in a Klystron in U.S. Pat. No. 5,101,168 issued to me on Mar. 31, 1992, for a "High Efficiency High Power Microwave Source" and assigned of record to the assignee of record of this application. The member 12 may provide the electron beam energy in pulses each with a duration of approximately one (1) microsecond (μsec) as depicted in FIG. 3. The energy in each electron beam pulse may be approximately one megavolt (1 Mv). The pulses may be produced with a duty cycle of less than 1:1000 (FIG. 3). When the pulse has a duration of one (1) microsecond, the time between successive pulses may be approximately one second (FIG. 3). The microwave energy 15 illustrated schematically at 15 in FIGS. 1 and 2.

The electron beam generated by member 12 is accelerated as by a linear accelerator 14, preferably to a speed approaching the speed of light. In this acceleration process, the electron beam becomes modulated at the frequency of a microwave source, emerging from the accelerator as energetic electron bunches which generates pulses of microwave energy such as illustrated schematically at 15 in FIG. 1. As shown in FIG. 2, the acceleration may be provided by a resonator 16 such as illustrated in U.S. Pat. No. 5,101,168. This resonator 16 may bunch the electrons at a suitable frequency such as approximately three gigahertz (3 GHz), while the electrons are being linearly accelerated. This may be seen from FIG. 3 which indicates such successive pulses at 18a and 18b and which indicates at 19 the modulations in the pulse 18a at the frequency of approximately three gigahertz (3 GHz).

In the alternate embodiment of FIG. 2, an unstable resonant cavity 16 is used to modulate (bunch) a steady electron beam produced by the electron gun 12. Electron bunches emerge as illustrated schematically at 15 in FIG. 2, modulated at the resonant frequency of the resonator cavity 16.

The bunch structure of the beam at 15 is further illustrated in FIG. 3, which indicates successive micropulses at 18a and 18b and which indicates at 19 the micropulse structure consisting of the individual electron bunches at the modulation frequency.

After acceleration, the electrons in the modulated pulses pass to a converter target 20. The converter target 20 may be constructed to produce energy in a second form different from microwave energy. For example, the converter target 20 may be constructed from a heavy material such as tungsten or tantalum having a high atomic number to provide photons in the form of brehmstalling X-rays. Since the x-rays are produced only when the electron bunches interact with the converter, the x-rays are also emitted in bunches at the modulation frequency, as schematically illustrated at 21 in FIGS. 1 and 2.

The modulated X-rays pass to an enclosure 22 which may be made from a metal to prevent a barrier to the passage of the microwave energy. However, the enclosure 22 does not provide a barrier to the passage of X-rays. These X-rays impinge on electrical circuitry 24 (FIGS. 1 and 2) in the enclosure and impair the operation of the electrical circuitry. Preferably the electrical circuitry may be provided on an integrated circuit chip. The modulated x-rays impair the operation of the electrical circuitry 24 by causing the generation of photoelectrons within the enclosure 24 at the modulation frequency. These photoelectrons impair or disable the operation of the electrical circuitry in the following ways:

1. A modulated current is developed in the electrical circuitry 24 as a result of movements of the photoelectrons from the electrical circuitry.
2. Capacitive charges are generated in the electrical circuitry 24 at the modulation frequency by the movements of the photoelectrons from the electrical circuitry.
3. An electromagnetic field is generated within the enclosure by the movements of the photoelectrons. The electromagnetic field remains generally within the enclosure 22.

The spectrum of the X-rays from the converter target 20 has an end-point kinetic energy equal to the electron energy and has a maximum flux at approximately one tenth (1/10) to one third (1/3) the electron kinetic energy. The dose ($D_o$) in rads (R) of X-rays along the beam axis one meter from a high-atomic number material for the converter target 20 is given by the following equation:

$$D_3(R) = 1.2 \times 10^3 \, V^{2.8} \, I, t \quad (1)$$

where

V = the accelerating voltage in MeV

I = the beam current in amps; and t = the time in seconds for generating each pulse.

The X-rays propagate through the air. The X-rays are attenuated by intervening material (e.g. physical walls or enclosures). There is an inverse square reduction from a point-source converter. The resulting dose at a distance X from the converter target 20 with a thickness d of absorbing material is $$D_o \frac{e - \mu p d}{X^2}$$

μ = the mass attenuation coefficient; and
ρ = the material density.

The energetic X-ray pulses are very penetrating. When the X-rays encounter a target such as the enclosure 22, they penetrate easily through such target even when the target provides microwave shielding. The X-rays interact with matter inside the target by driving photoelectric effect, Compton and pair production currents in the electronic components. This is similar to the mechanism for internal electromagnetic pulse (IEMP) except that the internal currents are driven at the modulation frequency. These photo currents can excite internal cavity resonances within the target. The X-rays effectively defeat the microwave protective shielding and directly couple damaging electromagnetic energy into the electrical circuitry 24, thereby disrupting the operation of the circuitry and even causing permanent damage to components.

Although the photons impair the operation of the electrical circuitry 24, they are not harmful to individuals within the vicinity of the photons. During the generation of the pulses (e.g. 18a and 18b), the photons generated have a peak dose of approximately one hundred (100) megarads. On an average basis, the dose generated is about one (1) rad. However, individuals withstand approximately four hundred (400) rads on an average basis without being injured.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. A method of impairing an operation of electrical circuitry, including the steps of:

generating pulses of electrons, bunching the electrons in each pulse, accelerating the bunched electrons in each pulse, converting the bunched electrons in each pulse to bunched photons, and directing the bunched photons in each pulse to the electrical circuitry for impairing the operation of the electrical circuitry.

2. A method as set forth in claim 1, including, the pulses of electrons having a duty cycle of less than 1:1000.

3. A method as set forth in claim 1, including, the pulses of electrons having a duration of approximately one microsecond (1 μsec.).

4. A method as set forth in claim 1, including, the pulses of electrons having a duration in the microsecond range and the electrons being bunched at a modulation frequency in the gigahertz range.

5. A method as set forth in claim 1, including, the bunched electrons in each pulse being accelerated.

6. A method as set forth in claim 1 including the photons constituting X-rays.

7. A method as set forth in claim 1, including, the bunched electrons in each pulse being directed to a member having properties of generating the bunched photons when subjected to the bunched electrons in each pulse.

8. A method as set forth in claim 1, including, the electrical circuitry being disposed within an enclosure impervious to microwave energy but enabling the passage of the photons therethrough.

9. A method of disabling an operation of electrical circuitry, including the steps of:

generating pulses of electrons, converting the electrons in the pulses to photons, and directing the photons to the electrical circuitry so as to impair the operation of the electronic circuitry.

10. A method as set forth in claim 9, including, the electrons being directed to a member having characteristics of converting energy from the electrons to photons and the photons having a range of energy wavelengths corresponding to x-rays.

11. A method as set forth in claim 9, including, the electrical circuitry being disposed within an enclosure having properties of preventing the passage of microwave energy into the enclosure and of enabling the passage of the photons into the enclosure.

12. A method as set forth in claim 11, including, the electrons being produced at a particular modulation frequency in each pulse and the electrons in each pulse being converted to the photons at the particular modulation frequency and the enclosure being resonant when subjected to the photons at the particular modulation frequency.

13. A method as set forth in claim 9, including, the pulses of electrons being generated by emitting electrons from a source and subjecting the source to a voltage of hundreds of Kilovolts in a duty cycle less than 1:1000.

14. A method as set forth in claim 9, including, the photons created by the beam electrons in turn producing photoelectrons in the electrical circuitry to impair the operation of the electrical circuitry.

15. A method of affecting an operation of electrical circuitry, including the steps of:

generating an electron beam in a packetized form, accelerating the electron beam in the packetized form, converting the electron beam in the packetized form into X-rays in a packetized form, and interacting the X-rays in the packetized form with the electrical circuitry so as to impair the operation of the electrical circuitry.

16. A method as set forth in claim 15, including, the electron beam in the packetized form having a duty cycle of less than 1:1000 and the electron beam in the packetized form being accelerated by subjecting the electron beam to an electrical field generated by applying a voltage of hundreds of kilovolts to produce the electrical field.

17. A method as set forth in claim 15, including, the electron beam being packetized at a first frequency and wherein the electron beam in the packetized form being modulated at a second modulation frequency higher than the first frequency and the modulated electron beam in the packetized form being converted to X-rays modulated at the second modulation frequency in the packetized form and the X-rays modulated at the second modulation frequency in the packetized form interacting with the electrical circuitry so as to impair the operation of the electrical circuitry.

18. A method as set forth in claim 17, including, the electron beam modulated at the second frequency being produced by bunching the electrons at the second frequency for acceleration.

19. A method as set forth in claim 17, including, the electrical circuitry being disposed within an enclosure and the enclosure being resonant at the second frequency when the X-rays in the packetized form interact with the electrical circuitry.

20. Apparatus for impairing an operation of electrical circuitry in an enclosure, the enclosure being impenetrable by microwave energy but being penetrable by energetic photons (x-rays), including, first means for producing pulses of an electron beam, second means responsive to the pulses of the electron beam for accelerating such pulses, and third means responsive to the accelerated pulses of the electron beam for intercepting such pulses and for producing pulses of photons for penetration through the enclosure and for interaction with the electrical circuitry so as to impair the operation of the electrical circuitry.

21. Apparatus as set forth in claim 20, wherein the second means is responsive to the accelerated pulses of the electron beam for modulating such accelerated pulses at a particular modulation frequency and the third means is responsive to the accelerated pulses of the electron beam for producing modulated pulses of energetic photons (x-rays) corresponding to such accelerated pulses.

\* \* \* \* \*